United States Patent
Duesberg et al.

(10) Patent No.: US 8,664,657 B2
(45) Date of Patent: Mar. 4, 2014

(54) ELECTRICAL CIRCUIT WITH A NANOSTRUCTURE AND METHOD FOR PRODUCING A CONTACT CONNECTION OF A NANOSTRUCTURE

(75) Inventors: Georg Duesberg, Dresden (DE); Franz Kreupl, Munich (DE); Robert Seidel, Dresden (DE); Gernot Steinlesberger, Otterfing (DE)

(73) Assignee: Qimonda AG, Munich (DE)

( * ) Notice: Subject to any disclaimer, the term of this patent is extended or adjusted under 35 U.S.C. 154(b) by 427 days.

(21) Appl. No.: 11/577,070

(22) PCT Filed: Oct. 11, 2005

(86) PCT No.: PCT/DE2005/001816
§ 371 (c)(1),
(2), (4) Date: Jan. 12, 2009

(87) PCT Pub. No.: WO2006/039907
PCT Pub. Date: Apr. 20, 2006

(65) Prior Publication Data
US 2009/0213830 A1    Aug. 27, 2009

(30) Foreign Application Priority Data
Oct. 11, 2004   (DE) .......................... 10 2004 049 453

(51) Int. Cl.
*H01L 29/00*   (2006.01)
*H01L 29/04*   (2006.01)
*H01L 29/10*   (2006.01)

(52) U.S. Cl.
USPC ................. 257/49; 257/64; 257/73; 438/142; 438/149

(58) Field of Classification Search
USPC ................. 455/333; 977/742–752, 842–848; 438/142, 149, 479, 532, 795; 257/9, 257/184, E21.09, E51.04, 49, 51, 64, 66, 73
See application file for complete search history.

(56) References Cited

U.S. PATENT DOCUMENTS

| | | | |
|---|---|---|---|
| 5,940,771 A * | 8/1999 | Gollnick et al. | 455/517 |
| 6,280,697 B1 * | 8/2001 | Zhou et al. | 423/414 |
| 6,325,909 B1 * | 12/2001 | Li et al. | 205/106 |
| 6,495,258 B1 * | 12/2002 | Chen et al. | 428/408 |
| 6,615,033 B1 * | 9/2003 | Cragun | 455/502 |

(Continued)

FOREIGN PATENT DOCUMENTS

| | | |
|---|---|---|
| DE | 19856295 A1 | 9/1999 |
| EP | 1496554 A2 | 1/2005 |
| WO | 0211216 A1 | 2/2002 |
| WO | 2006039907 A2 | 4/2006 |

OTHER PUBLICATIONS

R. Martel et al., "Ambipolar Electrical Transport in Semiconducting Single-Wall Carbon Nanotubes", Physical Review Letters, vol. 87, No. 25 (2001).

(Continued)

*Primary Examiner* — Simon Nguyen
(74) *Attorney, Agent, or Firm* — Dicke, Billig & Czaja, PLLC

(57) ABSTRACT

A circuit is disclosed. The circuit includes at least one nanostructure and a carbon interconnect formed by a substantially carbon layer, wherein the nanostructure and the carbon interconnect are directly coupled to one another.

22 Claims, 5 Drawing Sheets

(56) References Cited

U.S. PATENT DOCUMENTS

| | | | |
|---|---|---|---|
| 6,639,907 B2 * | 10/2003 | Neufeld et al. | 370/342 |
| 6,740,910 B2 | 5/2004 | Roesner et al. | |
| 6,798,000 B2 * | 9/2004 | Luyken et al. | 257/213 |
| 6,972,467 B2 * | 12/2005 | Zhang et al. | 257/401 |
| 6,987,302 B1 * | 1/2006 | Chen et al. | 257/368 |
| 7,094,692 B2 * | 8/2006 | Horibe et al. | 438/680 |
| 7,183,229 B2 * | 2/2007 | Yamanaka | 438/795 |
| 7,245,946 B2 * | 7/2007 | Liu | 455/574 |
| 7,247,897 B2 * | 7/2007 | Choi et al. | 257/288 |
| 7,329,897 B2 | 2/2008 | Nishikawa et al. | |
| 7,332,810 B2 * | 2/2008 | Awano | 257/746 |
| 7,335,603 B2 * | 2/2008 | Mancevski | 438/758 |
| 7,400,595 B2 * | 7/2008 | Callaway et al. | 370/311 |
| 7,413,971 B2 * | 8/2008 | Steinhogl et al. | 438/597 |
| 7,439,081 B2 * | 10/2008 | Furukawa et al. | 438/1 |
| 7,452,828 B2 * | 11/2008 | Hirakata et al. | 438/780 |
| 7,507,987 B2 * | 3/2009 | Kim et al. | 257/10 |
| 7,560,756 B2 * | 7/2009 | Chau et al. | 257/287 |
| 7,573,186 B2 * | 8/2009 | Shigematsu et al. | 313/309 |
| 7,579,272 B2 * | 8/2009 | Furukawa et al. | 438/643 |
| 7,801,065 B2 * | 9/2010 | Simpson et al. | 370/311 |
| 7,829,883 B2 * | 11/2010 | Furukawa et al. | 438/268 |
| 7,883,968 B2 * | 2/2011 | Nihei | 438/268 |
| 2003/0008692 A1 * | 1/2003 | Phelan | 455/574 |
| 2003/0143398 A1 * | 7/2003 | Ohki et al. | 428/398 |
| 2004/0142172 A1 * | 7/2004 | Sugiyama et al. | 428/403 |
| 2004/0222081 A1 * | 11/2004 | Tour et al. | 204/157.15 |
| 2004/0253996 A1 * | 12/2004 | Chen et al. | 455/574 |
| 2004/0264397 A1 * | 12/2004 | Benveniste | 370/311 |
| 2005/0018624 A1 * | 1/2005 | Meier et al. | 370/318 |
| 2005/0096101 A1 * | 5/2005 | Sayers | 455/574 |
| 2005/0129573 A1 * | 6/2005 | Gabriel et al. | 422/58 |
| 2005/0233704 A1 * | 10/2005 | Maekawa | 455/69 |
| 2005/0285116 A1 * | 12/2005 | Wang | 257/76 |
| 2006/0226551 A1 * | 10/2006 | Awano | 257/773 |
| 2007/0059947 A1 * | 3/2007 | Moriya et al. | 438/780 |
| 2007/0087492 A1 * | 4/2007 | Yamanaka | 438/166 |
| 2008/0053952 A1 * | 3/2008 | Okada et al. | 216/13 |
| 2008/0159943 A1 * | 7/2008 | Gu et al. | 423/445 B |
| 2008/0179590 A1 * | 7/2008 | Mancevski | 257/40 |
| 2009/0169951 A1 * | 7/2009 | Suenaga et al. | 429/30 |
| 2011/0159181 A1 * | 6/2011 | Kaneko et al. | 427/214 |
| 2011/0162966 A1 * | 7/2011 | Burke et al. | 204/547 |
| 2011/0212566 A1 * | 9/2011 | Portico Ambrosio et al. | 438/69 |

OTHER PUBLICATIONS

S. Heinze et al., "Carbon Nanotubes as Schottky Barrier Transistors", Physical Review Letters, vol. 89, No. 10 (2002).

A. Javey et al., "Ballistic Carbon Nanotube Field-Effect Transistors", Nature, vol. 424 (Aug. 2003) pp. 654-657.

Graham et al., "Towards the integration of carbon nanotubes in microelectronics", Diamond and Related Materials, vol. 13, Apr.-Aug. 2004, pp. 1296-1300.

W. Yu et al., "Spinose carbon nanotubes grown on graphitized DLC film by low frequency r.f. plasma-enhanced chemical vapor deposition", Diamond and Related Materials, vol. 12, No. 12, Dec. 2003, pp. 2203-2207.

X. Sun et al., "Growth of carbon nanotubes on carbon paper by Ohmically heating silane-dispersed catalytic sites", Chemical Physics Letters, vol. 363, No. 5-6, Sep. 16, 2002, pp. 415-421.

M. Nihei et al., "Simultaneous Formation of Multiwall Carbon Nanotubes and their End-Bonded Ohmic Contacts to Ti Electrodes for Future ULSI Interconnects", Japanese Journal of Applied Physics, vol. 43, No. 4B, Apr. 2004, pp. 1856-1859.

Hung et al., "Growth and Analysis of Polycrystalline Carbon for MOS Applications", Material Research Society Symposium Proceedings, vol. 427, 1996, pp. 317-322.

* cited by examiner

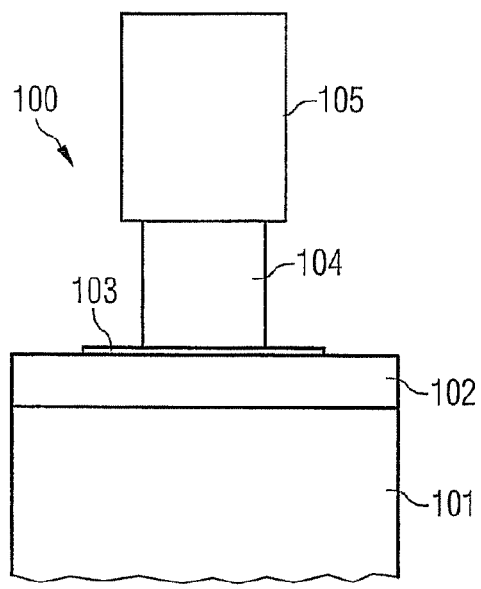
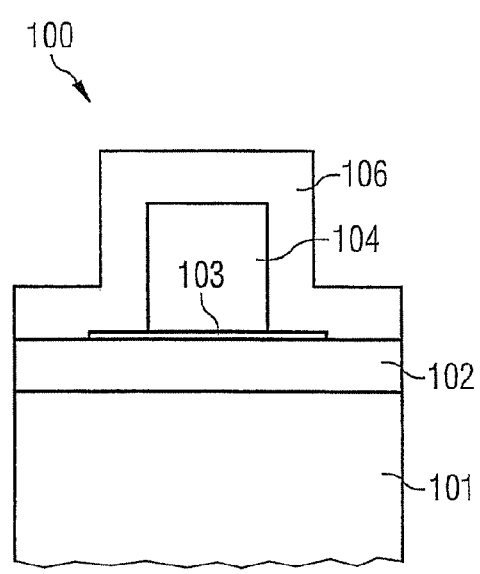
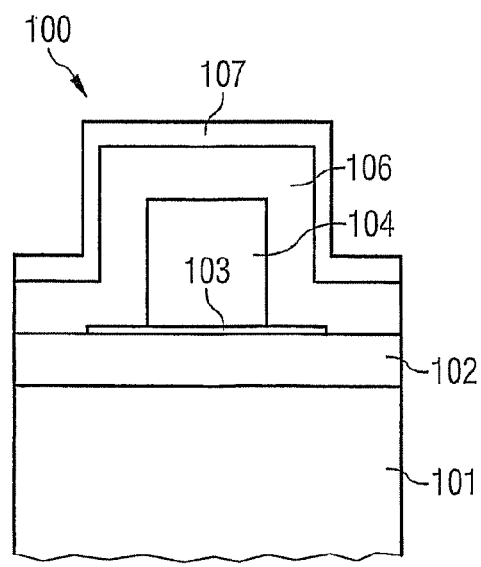

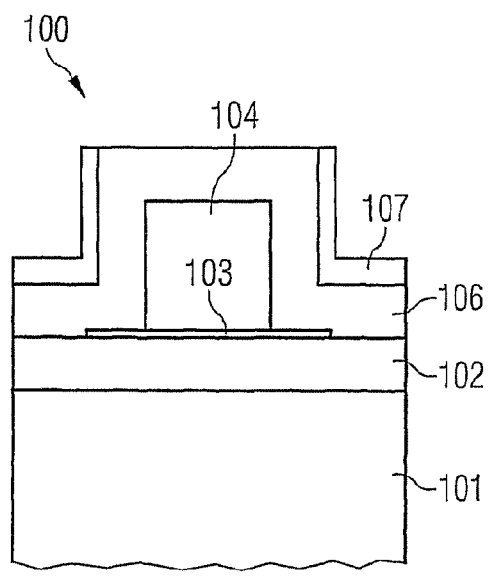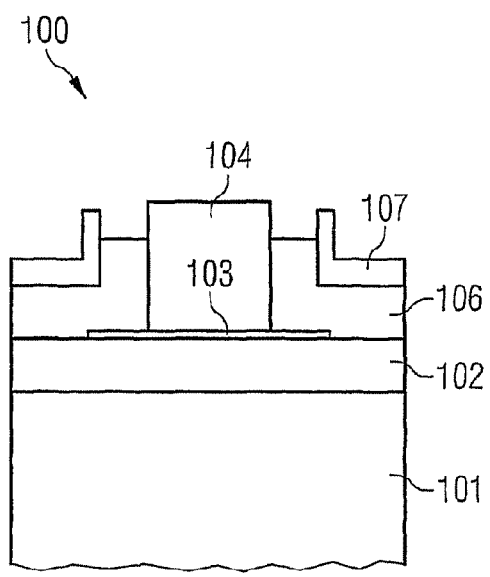

ELECTRICAL CIRCUIT WITH A NANOSTRUCTURE AND METHOD FOR PRODUCING A CONTACT CONNECTION OF A NANOSTRUCTURE

CROSS REFERENCE TO RELATED APPLICATION

This Utility Patent Application claims the benefit of the filing date of German Application No. DE 10 2004 049 453.3, filed Oct. 11, 2004, and International Application No. PCT/DE2005/001816, filed Oct. 11, 2005, both of which are herein incorporated by reference.

BACKGROUND

The invention relates to an electrical circuit with a nanostructure and a method for producing a contact-connection of a nanostructure.

Conventional silicon microelectronics will reach its limits as miniaturization advances further. In particular the development of increasingly smaller and more densely arranged transistors of, in the meantime, hundreds of millions of transistors per chip will be subject to fundamental physical problems and limitations in the next ten years. If structural dimensions fall below approximately 80 nm, the components are influenced by quantum effects in a disturbing manner, and they are dominated by quantum effects at dimensions of below about 30 nm. The increasing integration density of the components on a chip also leads to a dramatic increase in the waste heat.

A known possible successor technology to follow conventional semiconductor electronics is nanostructures such as, for example, nanotubes, in particular carbon nanotubes, and nanorods, also called nanowires.

A carbon nanotube is a single-wall or multiwall, tubular carbon compound. In the case of multiwall nanotubes, at least one inner nanotube is coaxially surrounded by an outer nanotube. Single-wall nanotubes typically have diameters of 1 nm, while the length of a nanotube may amount to hundreds of nm. The ends of a nanotube are often terminated with in each case half a fullerene molecule. Nanotubes can be produced by depositing a catalyst material layer, for example composed of iron, cobalt or nickel, on a substrate and, on said catalyst material layer, growing carbon nanotubes on the catalyst material layer using a CVD method ("chemical vapor deposition") by means of introducing a carbon-containing material (for example acetylene) into the method chamber. On account of the good electrical conductivity of carbon nanotubes and also on account of the adjustability of said conductivity, for example by means of applying an external electric field or by means of doping the nanotubes with potassium, for example, nanotubes are suitable for a large number of applications, in particular in the electrical coupling technology in integrated circuits, for components in microelectronics and also as electron emitters.

Field effect transistors are required for many integrated components in silicon microelectronics. Carbon nanotubes can be used for forming such a field effect transistor, whereby a so-called CNT-FET ("carbon nanotube field effect transistor") is formed R. Martel et al., "Ambipolar Electrical Transport in Semiconducting Single-Wall Carbon Nanotubes", Physical Review Letters, Vol. 87 No. 25 (2001) Art. 265805, S. Heinze et al., "Carbon Nanotubes as Schottky Barrier Transistors", Physical Review Letters, Vol. 89 No. 10 (2002) Art. 106801. For this purpose, by way of example, a nanotube is formed in planar fashion on a dielectric layer on a conductive substrate and contact-connected. The conductivity of the carbon nanotube is controlled by means of a suitable electrical voltage applied to the conductive substrate, with the result that the electric current flow through the nanotube, clearly the electric current flow between the source/drain terminals of the CNT-FET, can be controlled by means of applying a voltage to the conductive substrate.

One problem that can occur in the case of such a CNT-FET, however, is the relatively high contact resistance that forms between the channel region of the CNT-FET and the source/drain terminals and is produced at least partly by the formation of a Schottky barrier.

The formation of such a Schottky barrier is disadvantageous particularly in a second field of application in which CNTs can be used. In this case, CNTs are used as so-called vias or interconnects, that is to say as connecting lines between interconnects or electrical subcircuits situated on different planes of an electrical circuit, or else vias in so-called 3D integration, that is to say a suitable formation one above another or stacking one above another of the individual components or system units of the integrated circuit. It is thereby possible to increase the packing density and thus to reduce the space required in a plane. A further application of 3D integration is the stacking one above another of different integrated circuits of so-called systems which are intended to be integrated on a common chip, whereby a so-called system-on-chip (SoC) is formed.

In order to solve the problem of the high contact resistance, various metals are tested as contact electrodes in order to reduce the contact resistance with respect to CNTs. By way of example, in the case of single wall carbon nanotubes (SWCNT) having a large diameter, so-called transparent contacts, that is to say ohmic contacts, were obtained by producing the contacts with palladium A. Javey et al., "Ballistic Carbon Nanotube Field-Effect Transistors", Nature, Vol. 424 (August 2003) pp. 654-657, but such SWCNTs having a large diameter are only poorly suited to being used to form a CNT-FET. Further possibilities for reducing the contact resistance are, on the one hand, the formation of carbides by means of carbide-forming agents, for example titanium, and, on the other hand, the enlargement of the contact area, but only very few materials are known which can function as carbide-forming agents, and an enlargement of the contact area goes against the desire in microelectronics for miniaturizing all components.

Graham et al., "Towards the integration of carbon nanotubes in microelectronics" in Diamond and Related Materials, Vol. 13, April-August 2004, pp. 1296-1300 describes general concepts for the integration of carbon nanotubes in microelectronics, inter alia a concept for producing carbon nanotube vias, nickel being proposed for the contact-connection of the carbon nanotubes.

DE 198 56 295 C2 describes a gate-electrode-forming carbon layer of a pH-sensitive field effect transistor.

EP 1 496 554 A2 describes a thin-film transistor in which a threshold-voltage-controlling film is provided between a gate-insulating film and an organic semiconductor film, with the result that the threshold voltage can be controlled in a simple manner.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

Exemplary embodiments of the invention are illustrated in the figures and are explained in more detail below.

FIG. 1a shows a schematic sectional view of a layer arrangement after first partial steps of a method in accordance with one exemplary embodiment for producing a transistor.

FIG. 1b shows a schematic sectional view of the layer arrangement from FIG. 1a after additional partial steps of the method, which principally serve for forming a thin carbon film.

FIG. 1c shows a schematic sectional view of the layer arrangement from FIG. 1b after additional partial steps of the method, which principally serve for forming an etching mask.

FIG. 1d shows a schematic sectional view of the layer arrangement from FIG. 1c after additional partial steps of the method, which principally serve for the patterning of the etching mask.

FIG. 1e shows a schematic sectional view of the layer arrangement from FIG. 1d after additional partial steps of the method, which principally serve for the patterning of the thin carbon film.

DETAILED DESCRIPTION

Figure 2:
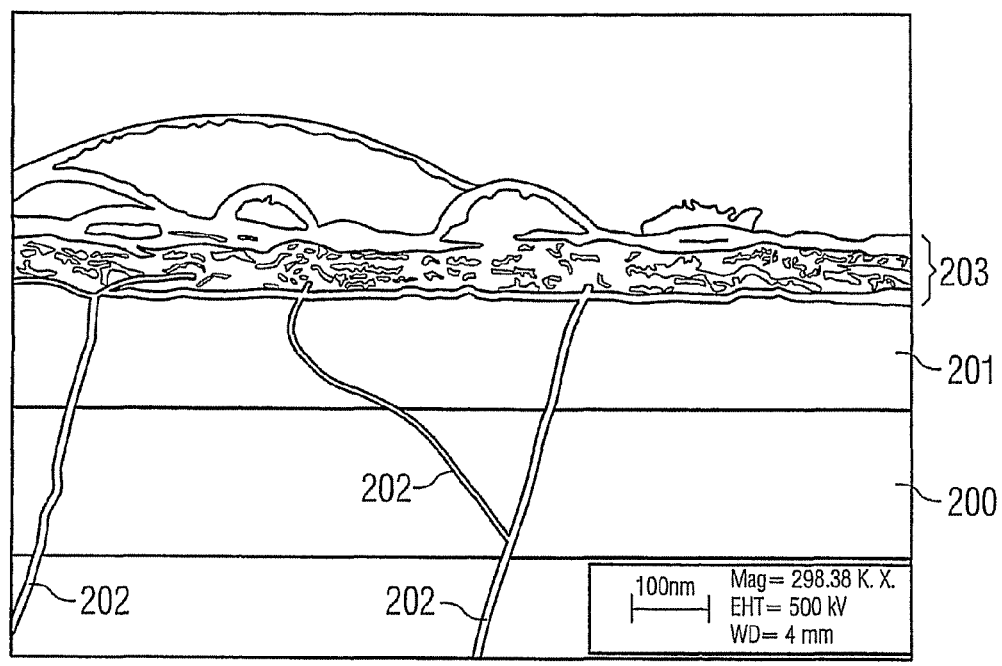
FIG. 2 shows a scanning electron microscope micrograph of a substrate having a network of carbon nanotubes and a carbon interconnect.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The invention is based on the problem of providing an electrical circuit with a nanostructure and a method for producing a contact-connection of a nanostructure, wherein a contact resistance between the nanostructure and an interconnect is reduced.

The problem is solved by means of the electrical circuit with a nanostructure and the method for producing a contact-connection of a nanostructure comprising the features in accordance with the independent patent claims.

An electrical circuit has at least one nanostructure and a carbon interconnect, which carbon interconnect is formed by means of a layer essentially comprising carbon, wherein the nanostructure and the carbon interconnect are directly coupled to one another. The carbon interconnect preferably has a resistivity of less than 1 mΩcm.

In a method for producing a contact-connection of a nanostructure on a substrate, a nanostructure and a carbon interconnect are formed, wherein the nanostructure and the carbon interconnect are formed in such a way that they are directly coupled to one another.

Clearly, one aspect of the invention can be seen in the fact that interconnects formed essentially from carbon are used instead of metallic interconnects for the contact-connection of nanostructures. The nanostructure and the carbon interconnect are directly coupled to one another or, to put it clearly, the nanostructure and the carbon interconnect can be in direct contact, that is to say that the nanostructure and the carbon interconnect can be in touching contact with one another. Through the use of carbon interconnects, the contact resistance of the contact-connections can be reduced for a multiplicity of materials. Furthermore, the very good processability of carbon and the possibility of formation in simple processes are advantageous with regard to carbon interconnects. It is also possible to form entire metallization systems whose interconnects essentially have carbon.

In this case, carbon interconnects can be formed in such a way that they have a resistivity comparable with that of metals. In particular, what can be achieved by using carbon as material of the interconnects is that, in the case of small feature sizes, that is to say feature sizes of less than 100 nm, the electron scattering processes in the interconnect can be reduced, which has the effect of not resulting in the rise in the resistivity such as can be observed in the case of metals for which, in the case of feature sizes of less than 100 nm, the resistivity afforded for macroscopic systems cannot be achieved. In particular the contact resistance of the carbon interconnects with respect to nanostructures having carbon is reduced since the thickness of the Schottky barrier can be reduced.

A further advantage of the use of carbon interconnects is that the carbon simultaneously acts as a diffusion barrier. Consequently, there is no need for special diffusion barriers such as used for example when copper is used as interconnect and silicon dioxide as dielectric, and which make the process for producing electrical circuits more difficult and slow it down. So-called adhesion prompting layers are not necessary either in the case of carbon interconnects, since carbon, in contrast to copper, for example, adheres on silicon oxide. Such diffusion barriers and adhesion promoting layers are usually produced from tantalum-based materials, which are expensive, when copper is used as material of the interconnects. The entire production process can therefore be shortened temporally and be made more cost-effective by obviating process steps. The time duration for the deposition of a layer composed of carbon which is used as a carbon interconnect is relatively short. Furthermore, a parallel so-called batch process is also possible with good reproducibility. In this case, the carbon layer has a roughness of 2 nm±0.3 nm with an average grain size of 1 nm to 2 nm.

A deposited carbon layer can also be patterned in a simple manner in order to form a carbon interconnect. This is possible for example by means of a hydrogen and/or oxygen plasma and/or air plasma.

Preferred developments of the invention emerge from the dependent claims. The further configurations of the invention which are described in connection with one of the independent claims are to be understood analogously in a reciprocal manner also as configurations of the respective other independent claim.

In one development, the nanostructure is a nanotube or a nanowire, the nanostructure preferably being a carbon nanostructure.

In particular the formation of a contact-connection between a carbon interconnect and a carbon nanostructure is particularly advantageous since, through the use of carbon for both structures, it is possible to reduce the contact resistance by the reduction of the Schottky barrier. Clearly, when forming a contact-connection between the nanostructure and the carbon interconnect, a network can be formed in which the carbon interconnect encloses the nanostructure at least in partial regions, whereby a particularly stable and low-resistance contact can be formed.

The electrical circuit may have a transistor in which the channel region of the transistor has the nanostructure, in particular a carbon nanostructure, and at least one of the source/drain regions of the transistor has the carbon interconnect. Preferably, both source/drain regions of the transistor have a carbon interconnect.

The electrical circuit preferably has at least one via that connects two planes of the electrical circuit to one another, the nanostructure being arranged in the at least one via and the carbon interconnect being arranged in one of the two planes. Particularly preferably, the electrical circuit has an additional carbon interconnect which is arranged in the other of the two planes, which additional carbon interconnect likewise makes direct contact with the nanostructure.

By providing two carbon interconnects which are formed on different planes of an electrical circuit and which are connected to one another by means of a via composed of a nanostructure, it is possible to create a particularly efficient, that is to say in particular low-resistance, connection of the two planes of an electrical circuit. The use of the nanostructures for forming a vertical connection or a so-called via is a simple manner of forming such vias. Moreover, it is possible to surround the nanostructures with a further carbon interconnect, that is to say clearly envelope them by means of a carbon interconnect, since this further carbon interconnect can be formed with optimum edge coverage and very good filling properties by means of a simple deposition process. Vertical connections having very high aspect ratios, i.e. height to width of the via, are possible both by means of nanostructures and by means of an enveloped nanostructure. Vias having aspect ratios of 100 to 200 can be realized according to the invention. Furthermore, the electrical conductivity of such a via is also at least comparable with that of highly doped polysilicon that is conventionally used for vias, with the result that a sufficient conductivity of the vertical connection can be ensured. According to the invention, it is also possible to form a plurality of vias in which nanostructures are arranged. It is also possible for a plurality of vias to be formed, nanostructures being arranged in only some, i.e. not in all, of said vias.

If entire electronic components, for example individual chips, are formed within the individual planes and are electrically conductively connected to one another by means of the via, it is possible to obtain a highly integrated 3D integration of chips. In particular, it is possible to stack different systems, i.e. components or chips having different functions, one above another and to produce so-called system-on-chips (SoC).

In one exemplary embodiment, the layer essentially comprising carbon is a polycrystalline carbon layer.

In the application, polycrystalline carbon layer is understood to mean a layer having in each case a graphitelike structure, i.e. a predominant sp2 modification, in partial regions. However, a large-area hexagonal structure is not formed. The individual partial regions having a graphitelike structure have a size which corresponds to the grain size of the polycrystalline carbon layer and is approximately 1 nm to 2 nm. Clearly, the individual partial regions with a hexagonal graphite structure are always interrupted again by regions in which a regular graphite structure is not present or in which the hexagonal graphite structures have at least a different orientation. Clearly, the individual partial regions having a regular graphite structure can be interpreted as "crystalline" regions. Consequently, the polycrystalline carbon has a multiplicity of "crystalline" regions. For this reason, in the context of this application, the term "polycrystalline carbon" has been chosen for the material. The individual crystalline regions, that is to say the graphite structures, generally have a preferred direction, that is to say that layer like structures made from the polycrystalline carbon form.

The carbon interconnect preferably has a resistivity of between 1 µΩcm and 1000 µΩcm, and particularly preferably a resistivity of between 1 µΩcm and 50 µΩcm.

Carbon interconnects having such resistivities, which are comparable with resistivities of metals, are particularly suitable for being used in electrical integrated circuits. Particularly when using the carbon interconnect in the case of small feature sizes, the resistance of the carbon interconnect is even lower than that of a metallic interconnect because in the case of the latter, as already mentioned, electron scattering processes occur in the case of feature sizes of less than 100 nm. In particular, the contact resistance with respect to nanostructures is reduced. The low resistance enables the RC switching times of the electrical circuits to be reduced. The low resistivities can be obtained with carbon interconnects which are doped by means of customary dopants such as boron, phosphorus or arsenic. An intercalation by means of metal halides such as, for example, arsenic fluoride ($AsF_5$) or antimony fluoride ($SbF_5$) is also possible. In the case of intercalation with $AsF_5$, by way of example, an electrical resistivity of up to 1.1 µΩcm can be obtained.

The resistivities of doped carbon interconnects are for example significantly lower than those of highly doped polysilicon, which is usually used in the prior art for the formation of vertical connections. Particularly in comparison with highly doped polysilicon, the carbon interconnect also has a better thermal conductivity, whereby heat that arises in the case of 3D integration can be dissipated better, whereby chip heating can be counteracted.

In one development, firstly the nanostructure is formed on the substrate and then the carbon interconnect is formed at the nanostructure.

In another development, firstly the carbon interconnect is formed on the substrate and then the nanostructure is formed at the carbon interconnect.

Preferably, a via is formed by means of the nanostructure, which via connects the carbon interconnect to a second interconnect, wherein the carbon interconnect and the second interconnect are arranged in different planes. Particularly preferably, the second interconnect is likewise formed as a carbon interconnect which is preferably formed by means of the same process as the carbon interconnect.

Clearly, both interconnects which make contact with the via are formed as carbon interconnects, whereby the contact resistance can be reduced in a particularly efficient manner since the Schottky barrier can thus be reduced at both contact-connections.

The carbon interconnect may be doped and/or intercollated.

The doping or intercalation makes it possible, in a simple manner, to obtain a resistivity of the carbon interconnect which is at least as good as or better than that of metallic interconnects.

Particularly preferably, the doped and/or intercollated carbon interconnect is thermally activated.

Particularly when fluorine is used as dopant, that is to say if fluorine is introduced into the carbon interconnect, thermal activation is a suitable method step for favorably influencing the properties, for example the resistivity, of the carbon interconnect. The thermal activation can be carried out by heating a gas situated in a chamber in which the electrical circuit is processed. An alternative possibility is to heat the wafer itself onto which the electrical circuit is processed, for example by means of an electrical heating of the so-called chuck.

In one configuration of the invention, a selective activation of the doped and/or intercollated carbon interconnect is carried out by means of a laser.

The use of a laser is a particularly suitable means for carrying out a selective activation of the doped and/or intercollated carbon interconnect since regions can be selectively thermally treated, i.e. heated, in a targeted manner by means of a laser.

The carbon-containing gas may be methane, ethane, alcohol vapor and/or acetylene.

These carbon-containing gases are particularly suitable for being used in the method for producing a polycrystalline carbon layer.

In one development, the carbon interconnect is formed in an atmosphere having a hydrogen partial pressure of between 1 hectopascal and 5 hectopascals and, at a temperature of between 600° Celsius and 1000° Celsius, as a layer essentially comprising carbon by means of a carbon-containing gas being supplied.

The described process of depositing the carbon interconnect makes it possible, in a simple manner, to form a layer essentially comprising carbon which has a low resistance and, in particular, a low contact resistance with respect to a nanostructure.

In one exemplary embodiment, the temperature is between 900° Celsius and 970° Celsius and the hydrogen partial pressure is essentially 1 hectopascal and, during the formation of the carbon interconnect, the amount of carbon-containing gas supplied is such that an overall pressure of between 500 hectopascals and 700 hectopascals is established.

As an alternative, the temperature is between 750° Celsius and 850° Celsius, the hydrogen partial pressure is essentially 1.5 hectopascals and, during the formation of the carbon interconnect, the amount of carbon-containing gas supplied is such that a partial pressure of the carbon-containing gas of between 9 hectopascals and 11 hectopascals is established.

Under these predetermined conditions, a formation of a layer for a carbon interconnect and a resistivity of less than 1 nm cm can be carried out particularly effectively and in a simple manner.

Preferably, the temperature is maintained at least partly by means of a photon heating and/or by means of the heating of the substrate on a hotplate.

The use of a photon heating, or a hotplate or, to put it another way, by means of a so-called chuck heating, that is to say a heating which heats the chuck on which the substrate is arranged, in order to provide at least part of the energy of the heating to the required temperature, is advantageous since it has been shown that the temperature in the method can be reduced in this case. As a result, when carrying out the method, a lower energy supply is required and the risk of destruction or damage of layers that have already been formed on or in the substrate is reduced.

Preferably, the formation of the carbon interconnect is supported by means of a radiofrequency plasma and/or a microwave plasma.

The use of a radiofrequency plasma and/or a microwave plasma makes it possible to reduce the deposition temperature of the carbon layer.

To summarize, one aspect of the invention can be seen in the fact that the invention creates an alternative to materials used hitherto for interconnects for the contact-connection of nanostructures. A carbon-based material is used instead of the previous use of metals, by means of which material carbon interconnects are formed. The carbon interconnects are distinguished by very simple and cost-effective production and simple processability. Furthermore, the contact resistance between the nanostructure and the carbon interconnect is lower, particularly if the nanostructure is formed as a carbon nanostructure since, in this case, the Schottky barrier is reduced. In this case, the carbon nanostructure may be formed as a so-called single-wall carbon nanotube (SWCNT) or as a so-called multiwall carbon nanotube.

Furthermore, particularly in the case of small structures or relative to doped polysilicon, the carbon interconnect has a lower resistivity than material that has been customary hitherto for interconnects in metallization systems. This makes it possible to reduce the switching times of the integrated circuits, that is to say to operate the integrated circuits with a faster clock. A further advantage of doped carbon is that the thermal conductivity of the doped carbon is better as well, whereby it is possible to achieve a better thermal coupling between different components in the 3D integration of integrated circuits, which leads to improved dissipation of heat toward the outside.

Another configuration of the invention provides for one or a plurality of carbon nanotubes to be contact-connected with a carbon layer as described above. In accordance with this configuration, the carbon nanotube(s) is/are set up as light-emitting elements and therefore clearly serve as light-emitting diodes.

FIG. 1a shows a schematic illustration of a layer arrangement 100 after first partial steps of a method in accordance with a first exemplary embodiment for producing an electrical circuit with carbon interconnects which are used for the contact-connection of carbon nanotubes, the electrical circuit being a carbon nanotube field effect transistor (CNT-FET).

A silicon oxide layer 102 is formed on a substrate 101, which, in accordance with this exemplary embodiment of the invention, additionally serves as a gate electrode and is formed from silicon. A layer of carbon nanotubes 103 is subsequently formed on the silicon oxide layer 102 by means of methods known per se, the channel region of the CNT-FET being formed from said carbon nanotubes in the course of the method. By way of example, carbon nanotubes can be produced by depositing a catalyst material layer, for example composed of iron, cobalt or nickel, on a substrate, in this case the silicon oxide layer 102, and, on said catalyst material layer, growing carbon nanotubes on the catalyst material layer using a CVD method ("chemical vapor deposition") by means of introducing a carbon-containing material (for example acetylene) into the method chamber.

A layer 104 composed of TEOS (tetraethyl orthosilicate), alternatively composed of SOG (Spin-on Glass), is formed at least on a portion of the layer of carbon nanotubes 103.

An explanation is given, referring to FIG. 1b, of partial steps of the method in accordance with the exemplary embodiment of the invention which principally serve for forming a thin carbon layer or carbon film.

From the layer sequence 100 of FIG. 1a, applied photoresist 105 used for the patterning of the layer 104 is removed and a thin carbon layer 106 having polycrystalline properties is subsequently formed. Various processes can be used for forming the polycrystalline carbon layer 106. A polycrystalline carbon layer is understood to be a layer which essentially comprises carbon and which has a graphite structure, that is to say a hexagonal lattice structure, which can be interpreted as crystalline, in partial regions. The individual "crystalline" partial regions having hexagonal structures are separated, however, by regions which have no hexagonal lattice structures, or at least by hexagonal lattice structures which have an orientation arranged differently than the adjacent "crystalline" partial regions.

The layer 104 therefore clearly serves to ensure that the carbon layer 106 is interrupted and the carbon nanotube transistor formed is not short-circuited. It should be pointed out in this connection that the process sequence described is not restrictive and should be understood only as an example of many possible process variants.

Generally, the particular suitability of the carbon layer as an electrode of an electronic component is evident from the above example.

In a first process, a hydrogen atmosphere with a pressure of approximately 0.001 bar, or 1 hectopascal, is generated at a temperature of between 900° Celsius and 970° Celsius, preferably 950° Celsius. A carbon-containing gas, for example methane ($CH_4$) or acetylene ($C_2H_4$), is subsequently introduced until a total pressure of approximately 0.6 bar, or 600 hectopascals, is established. Under these conditions, a polycrystalline carbon layer deposits on the surface of the layer arrangement 100. The carbon-containing gas is preferably introduced continuously during the deposition process, so that the total pressure remains essentially constant.

In a second process for producing a polycrystalline carbon layer, a hydrogen atmosphere of approximately 2 torr to 3 torr, preferably 2.5 torr, which corresponds to approximately 3.33 hectopascals, is generated at a temperature of approximately 800° Celsius. At the same time as heating by means of a normal furnace, a so-called photon furnace is used, that is to say a light source which additionally provides energy. This makes it possible to reduce the temperature compared with the method described above, which may be advantageous depending on the field of application. Afterward, a carbon-containing gas, for example methane ($CH_4$), acetylene ($C_2H_4$) or alcohol vapor, preferably ethanol vapor ($C_2H_5OH$), is once again introduced into the hydrogen atmosphere until a total pressure of between 6.5 torr and 8.5 torr, preferably 7.5 torr, which corresponds to approximately 10 hectopascals, is attained.

A polycrystalline carbon layer deposits under these conditions, too. In this process, too, the carbon-containing gas is preferably introduced continuously as long as the conformal deposition is carried out.

In all the processes described, the thickness of the carbon layer can be controlled by means of the duration of the deposition process.

An explanation is given, referring to FIG. 1c, of partial steps of the method in accordance with the exemplary embodiment of the invention which principally serve for forming an etching mask.

In order to form the etching mask, a metal layer 107 of suitable thickness composed of titanium or gold is formed on the thin carbon layer 106. A suitable thickness may be approximately 20 nm, depending on the application. The thin layer 107 composed of gold or titanium is subsequently polished mechanically in such a way that partial regions of the thin carbon layer 106 are uncovered in the region of the gate encapsulation 105, which is illustrated schematically in FIG. 1d.

The thin carbon layer 106 is subsequently patterned using the residual etching mask layer 107 in such a way that a first source/drain region 108 and a second source/drain region 109 are formed by means of it, which is shown schematically in FIG. 1e. In this case, the two source/drain regions 108 and 109 make contact with the carbon nanotubes 103 forming the channel region of the transistor. The patterning of the thin carbon layer 106 may be carried out by means of $H_2$ plasma etching, by way of example.

FIG. 2 shows a scanning electron microscope micrograph of a substrate having a network of carbon nanotubes and carbon interconnect and essentially corresponding to the layer sequence shown in FIG. 1a before the gate region was formed. A silicon substrate 200 can be discerned, on which a silicon oxide layer 201 is formed. A layer of carbon nanotubes 202 was formed on the silicon oxide layer 201, and a thin layer of carbon 203 was subsequently formed on said layer of carbon nanotubes. In order to check whether the carbon nanotubes withstand the subsequent process of forming the carbon layer 203 without any damage, the substrate 200 was broken and a scanning electron microscope micrograph of the resulting break edge was recorded, which is illustrated in FIG. 2. Carbon nanotubes can be discerned, which can be seen as light filaments in FIG. 2 and which project from the carbon layer 203 and from the break edge. Consequently, FIG. 2 shows that the carbon nanotubes withstand without any damage subsequent formation of a polycrystalline carbon layer by means of a process described above.

Figure 3A:
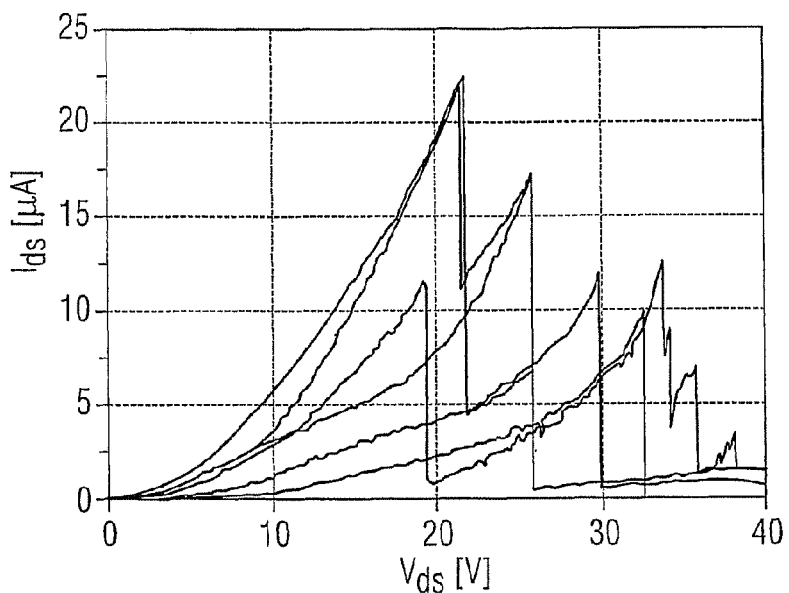
FIG. 3a shows diagrams of measured so-called burn-off curves of carbon nanotubes.

FIG. 3a shows diagrams of measured so-called burn-off curves of carbon nanotubes used in a CNT-FET, which CNT-FETs were produced by means of a process described in FIGS. 1a to 1e. The current intensity $I_{ds}$ in μA between drain and source terminals is plotted against the potential difference $V_{ds}$ in volts between drain and source terminals. So-called burn-off curves can be discerned, that is to say the curves show an increase in the drain-source current as the potential difference rises up to a point at which the carbon nanotubes burn off and the drain-source current decreases abruptly. FIG. 3a shows that the carbon nanotubes withstand without any damage both the formation of the polycrystalline carbon layer and a spin-on glass process carried out during the production of the CNT-FET at high temperatures of 950° Celsius, that is to say that the intrinsic properties of the carbon nanotubes are preserved even after a contact-connection by means of carbon. Maximum currents of between 10 nA and 25 nA were obtained, corresponding to current densities in the region of approximately $10^8$ A/cm$^2$.

Figure 3B:
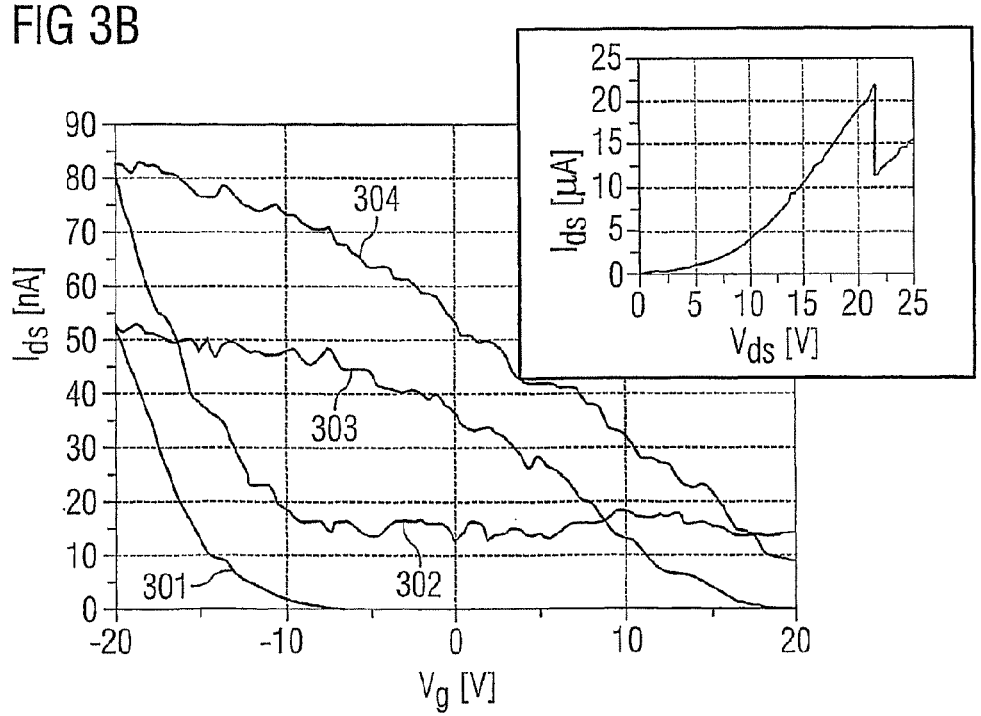
FIG. 3b shows characteristic curves of carbon nanotubes before and after the formation of a carbon interconnect.

FIG. 3b shows characteristic curves of a CNT field effect transistor in which the contact-connection of the channel region is formed by means of carbon interconnects, that is to say by means of source/drain regions composed of polycrystalline carbon. In the case of the characteristic curves in FIG. 3b, the current (in nanoamperes) between source region and drain region is plotted against the voltage (in volts) at the gate of the CNT field effect transistor. CNT field effect transistors typically have a hysteresis in their characteristic curve, as shown in FIG. 3b. The characteristic curve with hysteresis before the burn-off of the CNT field effect transistor is designated by the reference symbols 302 and 304 in FIG. 3b. The characteristic curve with hysteresis after the burn-off of the metallic carbon nanotubes (CNTs) of the CNT field effect transistor is designated by the reference symbols 301 and 303 in FIG. 3b. A large offset current $I_{offset}$, in particular, is shown in the characteristic curve 302, 304. In contrast thereto, a resultant low offset current $I_{offset}$, in particular, is shown in the characteristic curve 301, 303.

Figure 4:
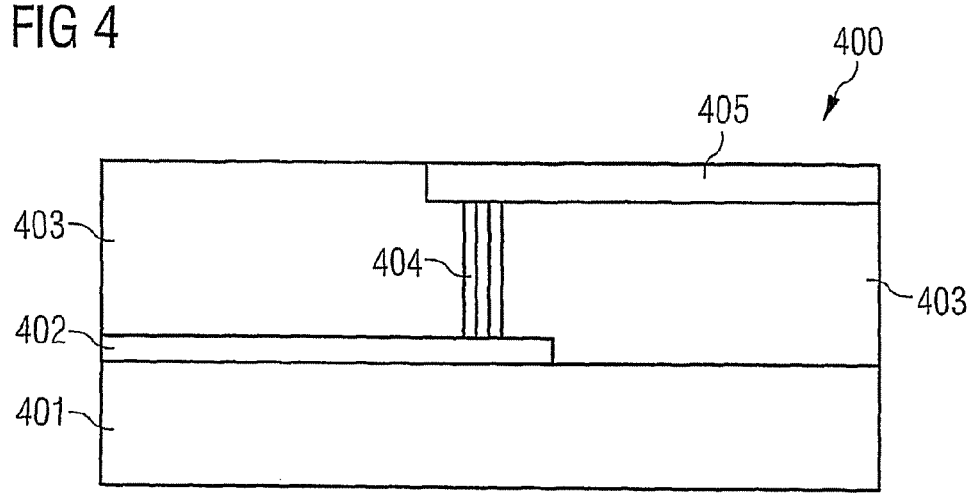
FIG. 4 shows a schematic illustration of a carbon nanotube via which is contact-connected by means of two carbon interconnects.

FIG. 4 shows a schematic illustration of a layer sequence 400 with carbon nanotubes which are contact-connected as via by means of two carbon interconnects.

The layer sequence 400 has a substrate 401, on which a first carbon interconnect 402 is formed. A passivation layer 403 is formed on said first carbon interconnect 401. The passivation layer 403 was patterned and a passage hole was formed, which uncovers a partial region of the first carbon interconnect 402. In the passage hole, carbon nanotubes 404, which are shown schematically and not to scale in FIG. 4, were then grown on the first carbon interconnect 401 by means of the known production processes, i.e. formation of a catalyst layer composed, for example, of iron, cobalt or nickel and growth thereon of the carbon nanotubes. Furthermore, the layer sequence 400 has a second carbon interconnect 405, which, like the first carbon interconnect 402, makes contact with the carbon nanotubes 404 and was produced in the same way as the first carbon interconnect 402 by means of one of the processes explained with reference to FIG. 1.

To summarize, one aspect of the invention can be seen in providing an electrical circuit with a nanostructure and a method for producing a contact-connection of a nanostructure, in particular a carbon nanostructure, which contact-connection has a low contact resistance. According to the invention, a so-called polycrystalline carbon layer is used for the contact-connection, which layer reduces the contact resistance, in particular the Schottky barrier, with respect to a nanostructure, particularly if the latter is formed as a carbon nanostructure, for example as a carbon nanotube. The method for producing the polycrystalline carbon layer is based on simple and customary process steps which are compatible with the use of a carbon nanostructure, that is to say that carbon nanostructures present are not destroyed during a subsequent process for forming the polycrystalline carbon layer. Furthermore, it is possible for the specific conductivity of the polycrystalline carbon to be increased further by carrying out a doping or a so-called intercalation of the polycrystalline carbon.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit comprising:
   at least one nanostructure; and
   a carbon interconnect formed by a layer essentially comprising carbon,
   wherein the nanostructure and the carbon interconnect are directly coupled to one another,
   wherein a thickness of the layer is controlled by means of the duration of a layer deposition process; and
   wherein the layer essentially comprising carbon is a polycrystalline carbon layer including crystalline regions having hexagonal lattice structures separated by regions having no hexagonal lattice structures or separated by regions having hexagonal lattice structures that have an orientation arranged differently than the adjacent crystalline regions.

2. The circuit as claimed in claim 1, in which the nanostructure is a nanotube or a nanowire.

3. The circuit of claim 2, in which the layer is free of nanotubes or nanowires.

4. The circuit as claimed in claim 1, in which the nanostructure is a carbon nanostructure.

5. The circuit as claimed in claim 1, in which the electrical circuit has a transistor, in which the channel region of the transistor has the nanostructure and one of the source/drain regions of the transistor has the carbon interconnect.

6. The circuit as claimed in claim 1, which has at least one via that connects two planes of the electrical circuit to one another, in which the nanostructure is arranged in the at least one via and in which the carbon interconnect is arranged in one of the two planes.

7. The circuit as claimed in claim 6, in which an additional carbon interconnect is arranged in the other of the two planes, which additional carbon interconnect is likewise directly coupled to the nanostructure.

8. The circuit as claimed in claim 1, in which the carbon interconnect has a resistivity of between 1 μΩcm and 1000 μΩcm.

9. The circuit as claimed in claim 1, in which the carbon interconnect has a resistivity of between 1 μΩcm and 50 μΩcm.

10. The circuit of claim 1, in which the layer is free of the nanostructure.

11. The circuit of claim 1, in which the layer encloses the nanostructure.

12. The circuit of claim 1, further comprising:
    a layer of tetraethyl orthosilicate or spin-on glass formed on the nanostructure and directly contacting the carbon interconnect.

13. A method for producing a circuit including a contact-connection of a nanostructure on a substrate, comprising:
    forming a nanostructure; and
    forming a carbon interconnect, where the nanostructure and the carbon interconnect are formed in such a way that they make direct contact with one another, wherein the carbon interconnect is formed by a layer essentially comprising carbon, wherein a thickness of the layer is controlled by means of the duration of a layer deposition process, and wherein the layer essentially comprising carbon is a polycrystalline carbon layer including crystalline regions having hexagonal lattice structures separated by regions having no hexagonal lattice structures or separated by regions having hexagonal lattice structures that have an orientation arranged differently than the adjacent crystalline regions.

14. The method as claimed in claim 13, comprising forming the nanostructure on the substrate and forming the carbon interconnect at the nanostructure.

15. The method of claim 14, in which the layer is free of nanotubes or nanowires.

16. The method as claimed in claim 13, comprising forming the carbon interconnect on the substrate and forming the nanostructure at the carbon interconnect.

17. The method as claimed in claim 13, in which the carbon interconnect is doped and/or intercalated.

18. The method as claimed in claim 17, comprising thermally activating an activation of the doped and/or intercalated carbon interconnect.

19. The method as claimed in claim 17, carrying out a selective activation of the doped and/or intercalated carbon interconnect by a laser.

20. The method of claim 13, in which the layer is free of the nanostructure.

21. The method of claim 13, in which the layer encloses the nanostructure.

22. The method of claim 13, further comprising:
    forming a layer of tetraethyl orthosilicate or spin-on glass on the nanostructure prior to forming the carbon interconnect.

* * * * *